United States Patent
Chang et al.

(10) Patent No.: US 6,465,849 B1
(45) Date of Patent: Oct. 15, 2002

(54) CMOS STRUCTURE HAVING DYNAMIC THRESHOLD VOLTAGE

(75) Inventors: Yao-Wen Chang, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/072,318

(22) Filed: Feb. 7, 2002

(30) Foreign Application Priority Data

Dec. 31, 2001 (TW) ........................................ 90133087 A

(51) Int. Cl.[7] .......................... H01L 29/76; H01L 29/94; H01L 31/062; H01L 31/113; H01L 31/119
(52) U.S. Cl. ........................................ 257/369; 257/368
(58) Field of Search ................................ 257/369, 368, 257/373, 374

(56) References Cited

U.S. PATENT DOCUMENTS 5,691,557 A * 11/1997 Watanabe .................... 257/357
6,147,386 A * 11/2000 Horiuchi ..................... 257/369

FOREIGN PATENT DOCUMENTS

JP 5-21737 * 1/1993

* cited by examiner

Primary Examiner—Ngân V. Ngô
(74) Attorney, Agent, or Firm—J.C. Patents

(57) ABSTRACT

A CMOS structure having a dynamic threshold voltage comprising of a MOS transistor, a first diode and a second diode. A first terminal of the first diode is coupled to the gate terminal of the MOS transistor and a second terminal of the first diode is coupled to the substrate of the MOS transistor. The first terminal of the second diode is coupled to a bulk voltage terminal and a second terminal of the second diode is coupled to the substrate of the MOS transistor.

15 Claims, 3 Drawing Sheets

CMOS STRUCTURE HAVING DYNAMIC THRESHOLD VOLTAGE

CROSS-REFERENCE TO RELATED APPLICATION

This application claims the priority benefit of Taiwan application serial no. 90133087, filed Dec. 31, 2001.

BACKGROUND OF THE INVENTION

1. Field of Invention

The present invention relates to a complementary metal oxide semiconductor (CMOS) structure having a dynamic threshold voltage. More particularly, the present invention relates to a CMOS structure having a dynamic threshold voltage capable of cutting off any parasitic diode.

2. Description of Related Art

A complementary metal oxide semiconductor (CMOS) structure consists of an N-type metal oxide semiconductor (NMOS) transistor and a P-type metal oxide semiconductor (PMOS) transistor. In the circuit design of a CMOS structure, the substrate of each MOS transistor is connected to a common bulk voltage. FIG. 1 is a schematic cross-sectional view of the NMOS transistor in a conventional CMOS structure. In the NMOS transistor, a $P^+$ ion-implanted region 105 is coupled to a terminal having a bulk voltage ($V_{bulk}$). According to conventional techniques, when the bias voltage of the substrate (the P-well) 109 relative to the $N^+$ ion-implanted region (source terminal) 101 or the $N^+$ ion-implanted region (drain terminal) 103 is a forward bias voltage, threshold voltage of the MOS transistor is lowered. Hence, the NMOS transistor has higher driving voltage. However, since the threshold is reduced, the leakage current will accordingly increase and a substrate voltage should be properly controlled, so as to avoid large forward diode current from substrate to source region.

To provide a lower threshold voltage to a CMOS structure, two major methods are frequently used. One technique is using an extra circuit to control the gate terminal and the substrate to have different voltages so that the forward bias voltage created by applying the voltage to the substrate causes a lowed threshold voltage. For the another technique, in a CMOS structure, both the gate terminal and the substrate use an identical voltage. Similarly, the forward bias voltage created by applying the voltage to the substrate causes a lowed threshold voltage. However, in the first case, because the gate terminal and the substrate have different voltages, extra circuit is required to control substrate bias voltage. Consequently, overall complexity of circuit design for channeling the extra circuit is increased. As to the second case, both the gate terminal and the substrate use an identical voltage. Hence, the use of the gate voltage ($V_G$) is restricted by the operation voltage of the diode (about 0.6 V). Ultimately, there is a limit to the operation voltage.

SUMMARY OF THE INVENTION

Accordingly, one object of the present invention is to provide a complementary metal oxide semiconductor (CMOS) structure having a dynamic threshold voltage. The CMOS structure includes a metal oxide semiconductor (MOS) transistor, a first diode and a second diode. A first terminal of the first diode is coupled to the gate terminal of the MOS transistor and a second terminal of the first diode is coupled to the substrate of the MOS transistor. A first terminal of the second diode is coupled to the bulk voltage and a second terminal of the second diode is coupled to the substrate of the MOS transistor. The above structure is for NMOS devices. If the PMOS devices are used, the connection direction for the diodes is reversed.

This invention also provides a second CMOS structure having a dynamic threshold voltage. The second CMOS structure includes a substrate, a MOS transistor, a first ion-implanted region, an isolation layer, a second ion-implanted region and a third ion-implanted region. The substrate has a well region. The MOS transistor has source/drain regions and a gate terminal. The source/drain regions are embedded within the well region. The source/drain regions are doped using dopants that differ from the well. The gate terminal is located above a channel region between the drain region and the source region. The first ion-implanted region is within the well. The first ion-implanted region and the drain/source region are adjacent to each other except for the isolation layer between them. The first ion-implanted region is electrically connected to the gate terminal. The first ion-implanted region, the source region and the drain region are doped with identical types of ions. The second ion-implanted region is also within the well adjacent to the first ion-implanted region. However, the second ion-implanted region contains dopants that differ from the first ion-implanted region. The third ion-implanted region is also within the well but adjacent to the second ion-implanted region. The third ion-implanted region contains dopants identical to the ones in the first ion-doped region and couples with a bulk voltage terminal.

This invention also provides a third CMOS structure having a dynamic threshold voltage. The third CMOS structure includes a substrate, a MOS transistor, a first ion-doped region, an isolation layer, a second ion-implanted region and a third ion-implanted region. The substrate has a well region. The MOS transistor has source/drain regions and a gate terminal. The source/drain regions are embedded within the well region. The source/drain regions are doped using dopants that differ from the well. The gate terminal is located above a channel region between the drain region and the source region. The first ion-implanted region is within the well. The first ion-implanted region and the drain region are adjacent to each other except for the isolation layer between them. The first ion-implanted region is electrically connected to the gate terminal. The first ion-implanted region, the source region and the drain region are doped with identical types of ions. The second ion-implanted region is also within the well adjacent to the first ion-implanted region. However, the second ion-implanted region contains dopants that differ from the first ion-implanted region. The third ion-implanted region is also within the well but detached from the second ion-implanted region. The third ion-implanted region contains dopants identical to the ones in the first ion-doped region and couples with a bulk voltage terminal. An alternative design of the CMOS structure further includes a fourth ion-implanted region. The fourth ion-implanted region is also within the well between the second and the third ion-implanted region. The fourth ion-implanted region contains dopants identical to the ones inside the second ion-implanted region.

In brief, this invention provides an equivalent circuit containing back-to-back diodes. Utilizing reverse bias saturation current due to a reverse bias voltage as well as the voltage drop provided by the second diode, substrate bias voltage of the CMOS structure can be adjusted. There is no restriction on the voltage applied to the gate terminal and no extra circuit needs to be supplied. Furthermore, the MOS transistor within the CMOS structure can operates under a larger operating current ($I_D$) at an identical low threshold voltage. Therefore, functional capacity of the CMOS structure greatly improves.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
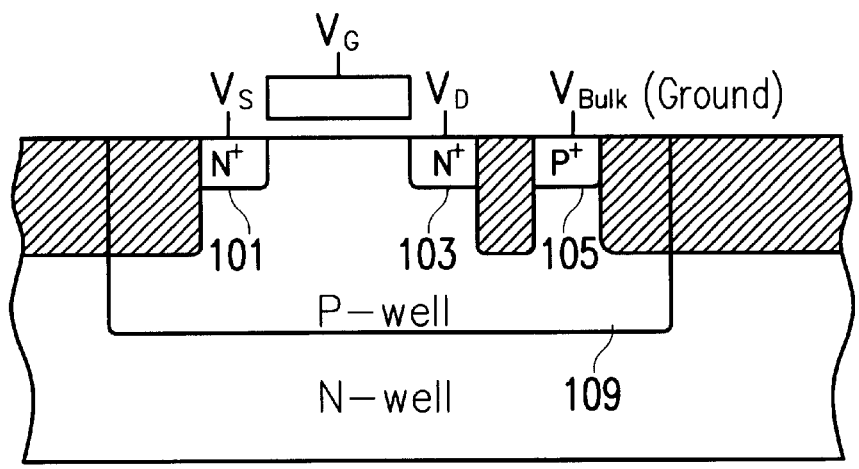
FIG. 1 is a schematic cross-sectional view of the NMOS transistor in a conventional CMOS structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
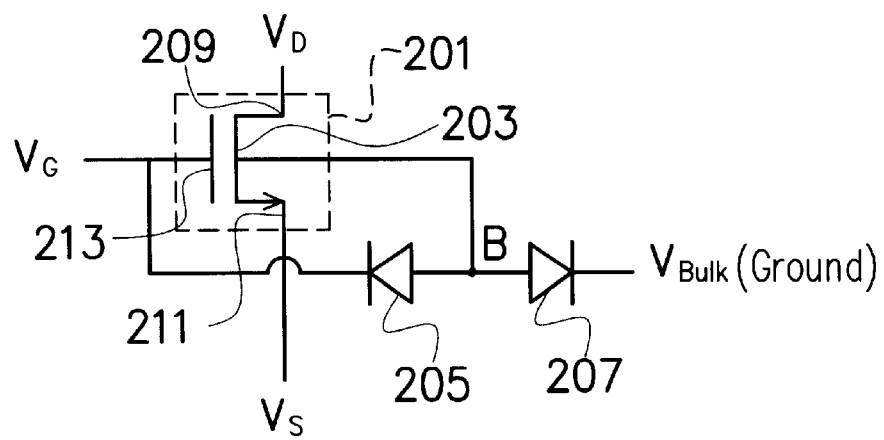
FIG. 2 is a simplified equivalent circuit diagram of a NMOS structure having a dynamic threshold voltage according to one preferred embodiment of this invention.

This invention provides a dynamic threshold metal oxide semiconductor (DTMOS) transistor. The threshold voltage of the DTMOS transistor may vary according to a bias voltage applied to the substrate when the channel of the MOS transistor is 'on' or 'off'. In the following, explanations detailing the NMOS transistor of a complementary metal-oxide-semiconductor (CMOS) structure are used. FIG. 2 is a simplified equivalent circuit diagram of a NMOS structure having a dynamic threshold voltage according to one preferred embodiment of this invention. As shown in FIG. 2, the DTMOS structure includes a NMOS transistor 201 and a pair of back-to-back diodes 205 and 207. The cathode of the diode 205 is coupled to the gate terminal 213 of the NMOS transistor and the cathode of the diode 207 is coupled to a bulk voltage ($V_{bulk}$) terminal. The anode of the diode 207 and the diode 205 are connected together at node B and also connected to the substrate 203 of the NMOS transistor. When the gate voltage ($V_G$) at the gate terminal 213 has a positive increase, voltage for the diode 205 is in reverse bias. Due to a leakage current inside the diode 205, a small reverse saturated current may be produced leading to conduction of the diode 205. However, the reverse saturated current is too small to trigger the diode 207 into conduction (because the bulk voltage ($V_{bulk}$) is generally connected to a ground) and creates a potential drop across the two terminals of the diode 207 of less than 0.6V. In other words, node B has a positive voltage smaller than 0.6V. Consequently, when the gate voltage ($V_G$) at the gate terminal 213 increases positively, voltage at node B increases by a small amount (voltage at node B will not excess the conductive voltage of the diode 207). The voltage at node B provides the substrate 203 with a forward bias voltage relative to the source terminal 211 or the drain terminal 209 and hence the threshold voltage of the NMOS transistor 201 is lowered. The forward bias voltage at the substrate 203 will not exceed the bias voltage of a parasitic diode current conducting between the source terminal 211 (region with N$^+$ ions) or the drain terminal 209 (region with N$^+$ ions) and the substrate 203 (region with P-type ions). Hence, the forward bias voltage at the substrate 203 will not lead to a conduction current at the junction between the substrate 203 and the source terminal 211 or the drain terminal 209.

Figure 3:
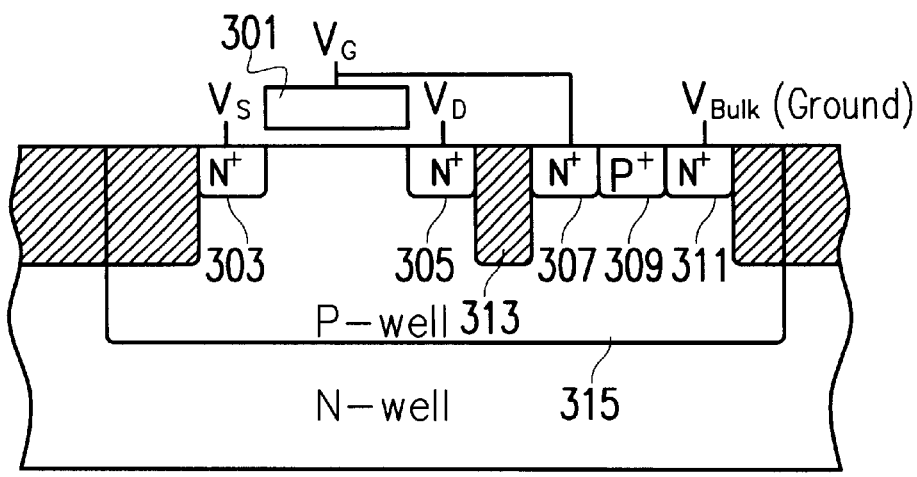
FIG. 3 is a schematic cross-section view of a portion of a NMOS structure according to a first preferred embodiment of this invention.
Figure 4:
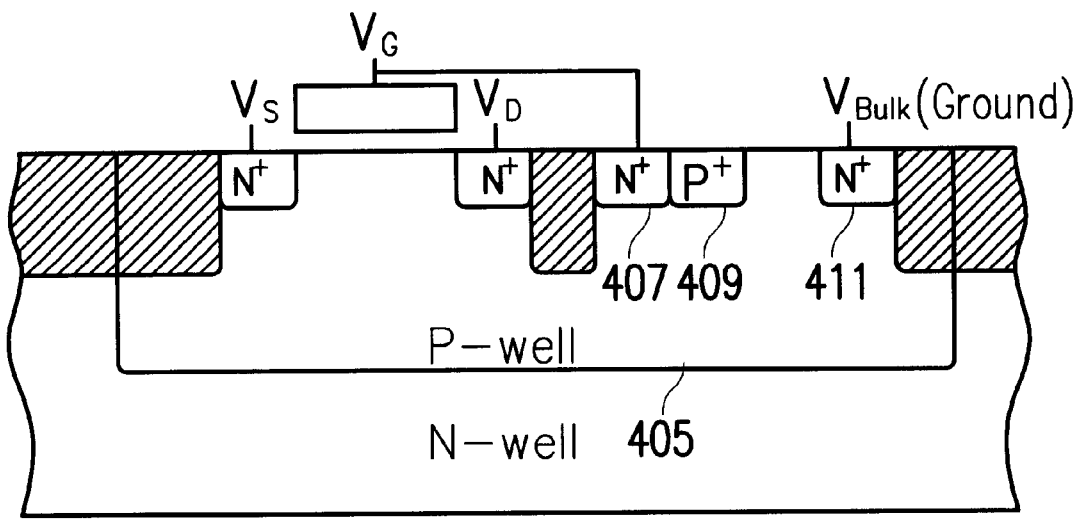
FIG. 4 is a schematic cross-section view of a portion of a NMOS structure according to a second preferred embodiment of this invention.
Figure 5:
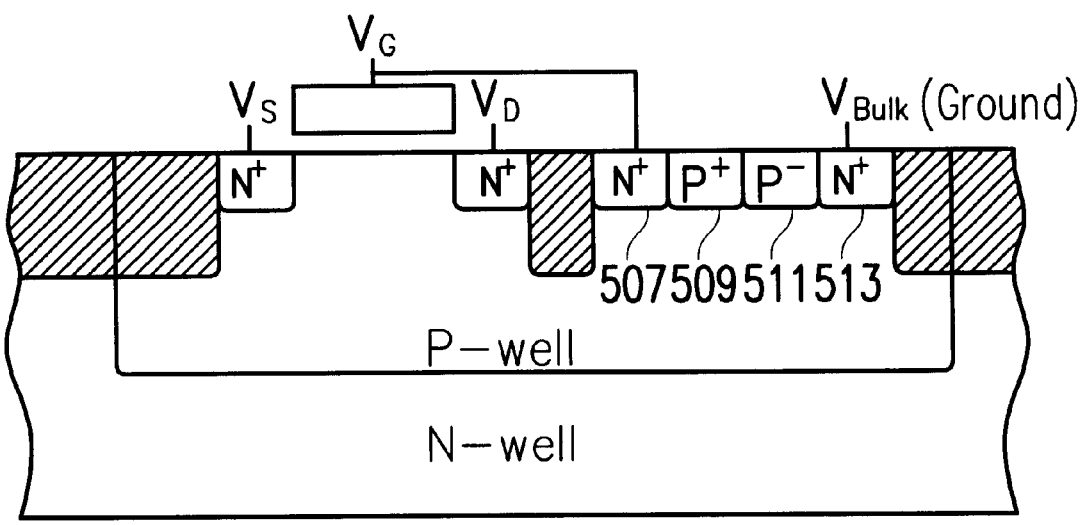
FIG. 5 is a schematic cross-section view of a portion of a NMOS structure according to a third preferred embodiment of this invention.

According to the equivalent circuit shown in FIG. 2, various NMOS structures are provided. FIGS. 3, 4 and 5 are partial cross-sectional views of NMOS transistor under different NMOS structural configurations according to this invention.

As shown in FIG. 3, aside from a gate region 301, an N$^+$ ion-implanted region (source terminal) 303, an N$^+$ ion-implanted region (drain terminal) 305 and an isolation layer (in this embodiment, the isolation layer has a shallow trench isolation structure) 313, the structure further includes three ion-implanted regions adjacent to the isolation layer 313. The three additional ion-implanted regions are an N$^+$ ion-implanted region 307, a P$^+$ ion-implanted region 309 and an N$^+$ ion-implanted region 311. The N$^+$ ion-implanted region (cathode) 307 and the P$^+$ ion-implanted region (anode) 309 together constitute a first diode. Similarly, the P$^+$ ion-implanted region (anode) 309 and the N$^+$ ion-implanted region (cathode) 311 together constitute a second diode. The first and the second diode together form a back-to-back diode pair similar to the diodes 205 and 207 in FIG. 2.

The gate region 301 of the MOS transistor is coupled to the N$^+$ ion-implanted region 307 so that the N$^+$ ion-implanted region (cathode) 307 receives an external voltage ($V_G$) when the voltage ($V_G$) is applied to the gate terminal 301. In addition, the N$^+$ ion-implanted region (cathode) 311 is connected to a bulk voltage ($V_{bulk}$) such as a ground. When the gate voltage ($V_G$) applied to the gate terminal 301 increases in a positive direction, the gate voltage ($V_G$) provides a reverse bias to the diode formed by the adjoining N$^+$ ion-implanted region 307 and P$^+$ ion-implanted region 309. However, the N$^+$ ion-implanted region 307 and P$^+$ ion-implanted region 309 is still subjected to the effect of the so-called reverse bias saturated current triggered by the gate voltage ($V_G$). Although the reverse bias saturated current provides a forward bias to the diode formed by the adjoining P$^+$ ion-implanted region 309 and the N$^+$ ion-implanted region 311, the reverse bias saturated current is too small to render the diode conductive. Hence, a voltage smaller than 0.6V appears in the P$^+$ ion-implanted region 309. Because the P-type well 315 is forward bias with respect to the N$^+$ ion-implanted region 303 and the N$^+$ ion-implanted region 305, channel-producing threshold voltage between the N$^+$ ion-implanted region 303 and the N$^+$ ion-implanted region 305 is lowered. Furthermore, since the forward bias voltage is smaller than 0.6V, current in the parasitic diode formed by the adjoining N$^+$ ion-implanted region 303 and the P-type well 315 or the N⁺ ion-implanted region 305 and the P-type well 315 due to a forward bias is prevented. Note that the passage of current from the P-type well 315 to the N⁺ ion-implanted region 303 or the N⁺ ion-implanted region 305 is strictly forbidden because such current may affect the operation of the MOS transistor.

The CMOS structures shown in FIGS. 4 and 5 contain some modifications to the CMOS structure shown in FIG. 3. In FIG. 4, although the N⁺ ion-implanted region 411 is not positioned next to the P⁺ ion-implanted region 409, the P⁺ ion-implanted region 409 and the N⁺ ion-implanted region 411 are connected together through a portion of the P-type well 405. Therefore, the CMOS structure still contains a pair of back-to-back diodes. In FIG. 5, the N⁺ ion-implanted region 507 and the P⁺ ion-implanted region 509 together form a first diode while the N⁺ ion-implanted region 513 and the P⁻ ion-implanted region 511 together form a second diode. The first and the second diode together constitute a pair of back-to-back diodes. However, in this CMOS structure, magnitude of the bias saturated current and the forward bias voltage may be changed through an adjustment of the doping concentration inside the P⁺ ion-implanted region 509 and the P⁻ ion-implanted region 511.

Figure 6:
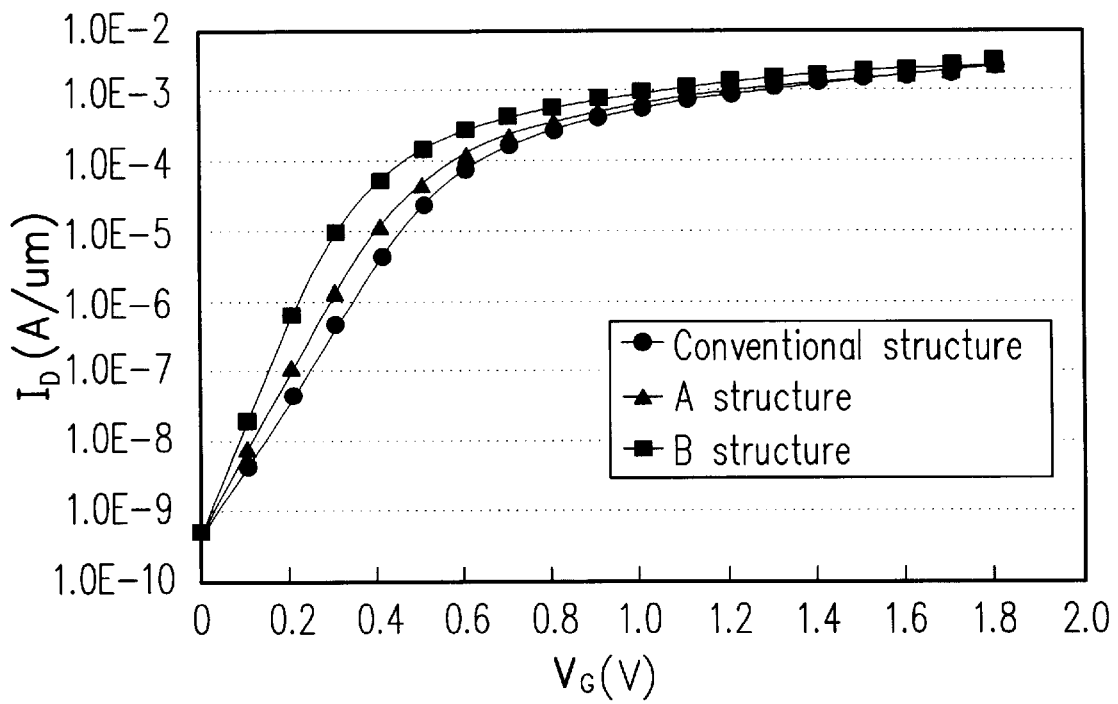
FIG. 6 is a graph comparing the $I_D$ versus $V_G$ characteristic curves between a conventional NMOS structure and the ones according to this invention.

FIG. 6 is a graph comparing the $I_D$ versus $V_G$ characteristic curves between a conventional NMOS structure and a NMOS structure as shown in FIGS. 3 and 4. The operating current ($I_D$) of various structures is indexed. As shown in FIG. 6, the structure according to this invention has a leakage current identical to a conventional structure when the gate voltage $V_G$ is 0V. However, as the gate voltage ($V_G$) is increased, the CMOS structures of this invention produce a higher operating current ($I_D$).

Figure 7:
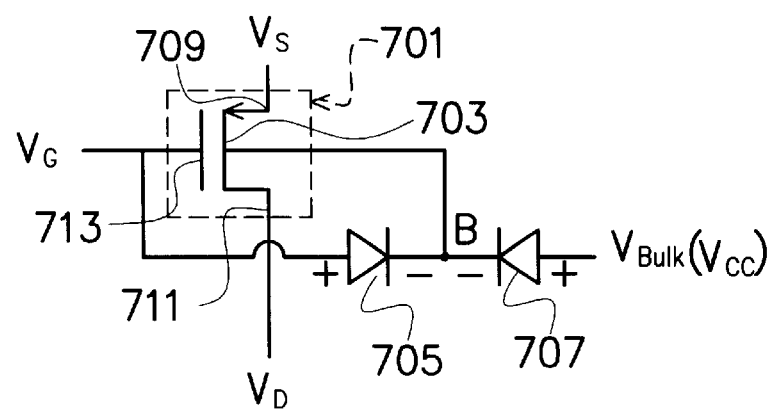
FIG. 7 is a simplified equivalent circuit diagram of a PMOS structure having a dynamic threshold voltage according to one preferred embodiment of this invention.

In the foregoing circuit design about the dynamic threshold voltage for a CMOS, the NMOS transistor can also be replaced by a PMOS transistor. FIG. 7 is a simplified equivalent circuit diagram of a PMOS structure having a dynamic threshold voltage according to one preferred embodiment of this invention. In FIG. 7, the DTMOS includes a PMOS transistor 701 and back-to-back two diodes 705, 707. The diode 705 has a first terminal coupled to a gate electrode 713 of the PMOS transistor 701. A first terminal of the diode 707 is coupled to a bulk voltage (Vcc). The second terminals of the first diode 705 and the second diode 707 are connected together (node A), and also coupled to a substrate 703 of the PMOS transistor 701. The operation principle in FIG. 7 is similar to the operation principle in FIG. 2, and the detail is not further described. However, the first terminals and the second terminals of the diodes 705, 707 in FIG. 7 and the first terminals and the second terminals of the diodes 205, 207 in FIG. 2 are different according to the transistor type of P-type or N-type. For example in FIG. 7, the first terminals of the diodes 705 and 707 are connected to an anode and the second terminals of the diodes 705 and 707 are connected to a cathode, but the connection is reversed in FIG. 2.

In summary, this invention provides a pair of back-to-back diode circuit and utilizes the reverse bias saturated current due to a reverse bias voltage and the voltage drop due to bulk voltage at the diode to control the substrate bias in the CMOS structure. Hence, the operating current increases even if the gate terminal of the NMOS transistor is subjected to an identical voltage. Furthermore, the CMOS structure is able to prevent the conduction of parasitic diodes formed by the substrate and an adjoining source terminal or drain terminal due to an excessive substrate forward bias voltage. Ultimately, overall performance of the CMOS device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A complementary metal-oxide-semiconductor (CMOS) structure having a dynamic threshold voltage, comprising:
   a metal-oxide-semiconductor (MOS) transistor;
   a first diode having a first terminal coupled to the gate terminal of the MOS transistor and a second terminal coupled to the substrate of the MOS transistor; and
   a second diode having a first terminal coupled to a bulk voltage terminal and a second terminal coupled to the substrate of the MOS transistor.

2. The CMOS structure of claim 1, wherein the MOS transistor is selected from a group consisting of an N-channel MOS transistor and a P-channel MOS transistor.

3. The CMOS structure of claim 2, wherein when the N-channel MOS transistor is used, the bulk voltage terminal is connected to ground, and when the P-channel MOS transistor is used, the bulk voltage terminal is connected to a system voltage Vcc.

4. A complementary metal-oxide-semiconductor (CMOS) structure having a dynamic threshold voltage, comprising:
   a substrate having a well region;
   a metal-oxide-semiconductor (MOS) transistor having a drain region and a source region disposed within the well region, wherein the drain region and the source region are doped using ions that differ from the well, and a gate electrode formed above a channel region between the drain region and the source region;
   a first ion-implanted region within the well adjacent to the drain region or the source region but separated by an isolation structure, wherein the first ion-implanted region is doped using ions that are identical to the drain region and the source region, and the first ion-implanted region is also electrically connected to the gate electrode;
   a second ion-implanted region within the well, wherein the second ion-implanted region is adjacent to the first ion-implanted region and the second ion-implanted region contains implanted ions that differ from the first ion-implanted region; and
   a third ion-implanted region within the well adjacent to the second ion-implanted region, wherein the third ion-implanted region is doped using ions that are identical to the first ion-implanted region and the third ion-implanted region is also electrically connected to a bulk voltage terminal.

5. The CMOS structure of claim 4, wherein the well is either an N-type ion implanted region or a P-type ion implanted region.

6. The CMOS structure of claim 4, wherein the type of ions implanted into the source region and the drain region is either N⁺ ions or P⁺ ions.

7. The CMOS structure of claim 6, wherein when the N-channel MOS transistor is used, the bulk voltage terminal is connected to ground, and when the P-channel MOS transistor is used, the bulk voltage terminal is connected to a system voltage Vcc.

8. The CMOS structure of claim 4, wherein the isolation structure includes a shallow trench isolation structure.

9. A complementary metal-oxide-semiconductor (CMOS) structure having a dynamic threshold voltage, comprising:

a substrate having a well region;

a metal-oxide-semiconductor (MOS) transistor having a drain region and a source region disposed within the well region, wherein the drain region and the source region are doped using ions that differ from the well, and a gate electrode is formed above a channel region between the drain region and the source region;

a first ion-implanted region within the well adjacent to the drain region but separated from the drain region by an isolation structure, wherein the first ion-implanted region is doped using ions that are identical to the drain region and the source region, and the first ion-implanted region is also electrically connected to the gate electrode;

a second ion-implanted region within the well, wherein the second ion-implanted region is adjacent to the first ion-implanted region and the second ion-implanted region contains implanted ions that differ from the first ion-implanted region; and a third ion-implanted region within the well adjacent but detached from the second ion-implanted region, wherein the third ion-implanted region is doped using ions that are identical to the first ion-implanted region and the third ion-implanted region is also electrically connected to a bulk voltage terminal.

10. The CMOS structure of claim 9, wherein the structure further includes a fourth ion-implanted region between and adjacent to the second and the third ion-implanted region, and the fourth ion-implanted region contains implanted ions identical to the implanted ions in the second ion-implanted region.

11. The CMOS structure of claim 10, wherein the fourth ion-implanted region has a dopant concentration smaller than the second ion-implanted region.

12. The CMOS structure of claim 9, wherein the well is either an N-type ion implanted region or a P-type ion implanted region.

13. The CMOS structure of claim 9, wherein the type of ions implanted into the source region and the drain region is either $N^+$ ions or $P^+$ ions.

14. The CMOS structure of claim 9, wherein when the MOS transistor is an N-channel MOS transistor, the bulk voltage terminal is connected to ground, and when the MOS transistor is a P-channel MOS transistor, the bulk voltage terminal is connected to a system voltage Vcc.

15. The CMOS structure of claim 9, wherein the isolation structure includes a shallow trench isolation structure.

* * * * *